United States Patent
Kameda et al.

[11] Patent Number: 6,130,484
[45] Date of Patent: Oct. 10, 2000

[54] SEMICONDUCTOR DEVICE

[75] Inventors: Hideo Kameda; Naoto Ueda; Yoichi Goi; Hideki Taniguchi, all of Tokyo, Japan

[73] Assignee: Mitsubishi Denki Kabushiki Kaisha, Tokyo, Japan

[21] Appl. No.: 08/989,819

[22] Filed: Dec. 12, 1997

[30] Foreign Application Priority Data

Jul. 17, 1997 [JP] Japan .................................... 9-192876

[51] Int. Cl.7 ........................ H01L 23/48; H01L 23/52; H01L 29/40
[52] U.S. Cl. ...................... 257/786; 257/784; 257/202; 257/203
[58] Field of Search .................... 257/786, 666, 257/202, 203, 48

[56] References Cited

U.S. PATENT DOCUMENTS

| | | | |
|---|---|---|---|
| 5,206,529 | 4/1993 | Mine | 257/202 |
| 5,300,795 | 4/1994 | Shintani | 257/203 |

FOREIGN PATENT DOCUMENTS

| | | | |
|---|---|---|---|
| 58-93244 | 6/1983 | Japan | 257/786 |
| 60-234341 | 11/1985 | Japan | 257/786 |
| 63-250141 | 10/1988 | Japan | 257/786 |
| 2244755 | 9/1990 | Japan . | |
| 3106043 | 5/1991 | Japan . | |
| 3-152956 | 6/1991 | Japan | 257/786 |
| 4171843 | 6/1992 | Japan . | |
| 5-308136 | 11/1993 | Japan | 257/786 |
| 6-84895 | 3/1994 | Japan | 257/786 |

Primary Examiner—Mahshid Saadat
Assistant Examiner—Jhihan B. Clark
Attorney, Agent, or Firm—Leydig, Voit & Mayer, Ltd.

[57] ABSTRACT

A semiconductor device includes a buffer region having buffers and disposed along a side of a semiconductor chip; a pad region having pads corresponding to the buffers and disposed outside the buffer region on the semiconductor chip; signal lines connecting the buffers to corresponding pads; and power supply lines and ground lines connected to extra pads, either of the power supply lines or the ground lines being partially superimposed on part of and separated from the signal lines by insulating layers.

5 Claims, 5 Drawing Sheets b > a

SEMICONDUCTOR DEVICE

BACKGROUND OF THE INVENTION

1. Field of the Invention

The present invention relates to a semiconductor device of a master slice type such as gate array, and particularly to a layout of bonding pads and buffers with a narrow pitch for wire bonding.

2. Description of the Prior Art

FIG. 8 is a view showing a chip configuration of a prior art semiconductor device of a master slice type using bonding pads and buffers arranged with a narrow pitch, and FIG. 9 is a partially enlarged view showing a configuration of the bonding pads and the buffers in a portion A surrounded by a broken line of FIG. 8. In these figures, reference numeral 1 indicates a bonding pad; 1a and 1b are an outer peripheral bonding pad and an inner peripheral bonding pad, respectively; reference numeral 2 is a buffer; reference numeral 3 is a wiring connecting each of the outer and inner peripheral pads 1a and 1b to the buffer 2; reference numeral 4 is a bonding pad for power supply; reference numeral 5 is a bonding pad for grounding; reference numeral 6 is a wiring connecting the power supply bonding pad 4 to a power supply; reference numeral 7 is a wiring connecting the grounding bonding pad 5 to the ground; and reference numeral 8 is an interconnection connecting the buffer 2 to an internal circuit. Further, character a indicates a pitch of each of the outer peripheral bonding pads 1a and the inner peripheral bonding pads 1b which are arranged in a staggered manner. The wirings include a signal line, a power supply line, and the ground line and, as shown in FIG. 7, the width of the wiring connecting a power supply or the ground to the buffer is generally larger than that of the wiring as the signal line. The reason for this is that since a large amount of current flows through the wiring as the power supply line or ground line, the wiring must ensure reliability against electromigration or the like by increasing its width.

SUMMARY OF THE INVENTION

In the prior art semiconductor device having the above configuration, the outer peripheral bonding pads 1a are proximate to the inner peripheral bonding pads 1b, and to further reduce the pitch a of the bonding pads, the size of each bonding pad 1 must be reduced. The reduction in size of each bonding pad 1, however, causes difficulty in wire bonding. In addition, the reduction in width of each buffer 2 elongates the shape thereof, which limits design of the buffers, and also causes a necessary narrowing of each wiring connecting the bonding pad 1 to the buffer 2, thereby exerting an adverse effect on the reliability of the integrated circuit IC.

To solve the above-described problems, the present invention has been made, and an object of the present invention is to provide a semiconductor device capable of making small a pitch of bonding pads connected to buffers including I/O (input and output circuit configuration) ports arranged on four sides of a semiconductor chip without making the size of each bonding pad so small, thereby sufficiently ensuring the width of each wiring connecting the bonding pad to the buffer.

According to a first aspect of the present invention, there is provided a semiconductor device including a buffer region having a plurality of buffers and disposed on a side of a semiconductor chip; a pad region having pads of the number at least corresponding to that of the buffers and disposed outside the buffer region; signal lines connecting the buffers to the corresponding ones of the pads; and power supply lines and ground lines connected to the excess of the pads; wherein at least either the power supply lines or the ground lines are partially superimposed on part of the signal lines through insulating layers.

In accordance with the first aspect, since either power supply lines or ground lines connected to the excess of pads of the number larger than that of buffers are partially superimposed on part of signal lines through insulating layers, the pads connected to the signal lines concerned can be arranged to be drawn toward a corner of a semiconductor chip. Thus, the pitch of the arranged pads of the number corresponding to that of the buffers is not required to be excessively narrowed correspondingly to the pads connected to the drawn signal lines. This eliminates the necessity of significantly reducing the size of each bonding pad, to thereby facilitate the wire bonding step. In addition, the buffer area to which the superimposed signal lines are connected can be used as the I/O ports in accordance with the above configuration.

According to a second aspect of the present invention, there is provided a semiconductor device including a buffer region including a plurality of buffers arranged on a side of a semiconductor chip; a pad region having pads of the number at least corresponding to that of the buffers, the pads being disposed outside the buffer region and connected to the buffers through signal lines; and pads disposed inside the buffer region and connected to power supply lines and ground lines.

In accordance with the second aspect, a pad region including pads disposed outside a buffer region and connected to signal lines is provided separately from pads disposed inside the buffer region an connected to power supply lines and ground lines, so that only the pads connected to the buffers for signals can be disposed in the pad region. As a result, it is possible to effectively use I/O ports which have been conventionally not used for ensuring a pad area for power supply and grounding. Also, since the pitch of pads in the pad region can be set correspondingly to the number of the buffers, the size of each pad and the width of each wiring connected to the buffer can afford to be relatively large. This is effective to reduce the size of a chip without affecting the wire bonding step and the reliability of the IC.

According to a third aspect of the present invention, there is provided a semiconductor device in which each signal line is composed of a first signal line and a second signal line, and these first and second signal lines are partially superimposed to each other through a different insulating layer.

In accordance with the third aspect, even when a pad region is narrow, the pitch of the pads can be suitably set not to be excessively narrowed by making use of the superimposition of the signal lines, so that the size of each pad is not required to be made excessively small. As a result, in addition to the above effects, the degree of freedom in design can be increased.

According to a fourth aspect of the present invention, there is provided a semiconductor device in which part of pads in a pad region are at least connected to either power supply lines or ground lines, and at least either the power supply lines or the ground lines connected to the pads are partially superimposed on part of signal lines through insulating layers.

In accordance with the fourth aspect, even when pads connected to power supply lines or ground lines cannot be arranged inside a buffer region under any restriction, the pitch of the pads in a pad region is not required to be narrowed by making use of the above superimposition.

DESCRIPTION OF THE PREFERRED EMBODIMENTS

Hereinafter, preferred embodiments of the present invention will be described with reference to the accompanying drawings.

First Embodiment

Figure 1:
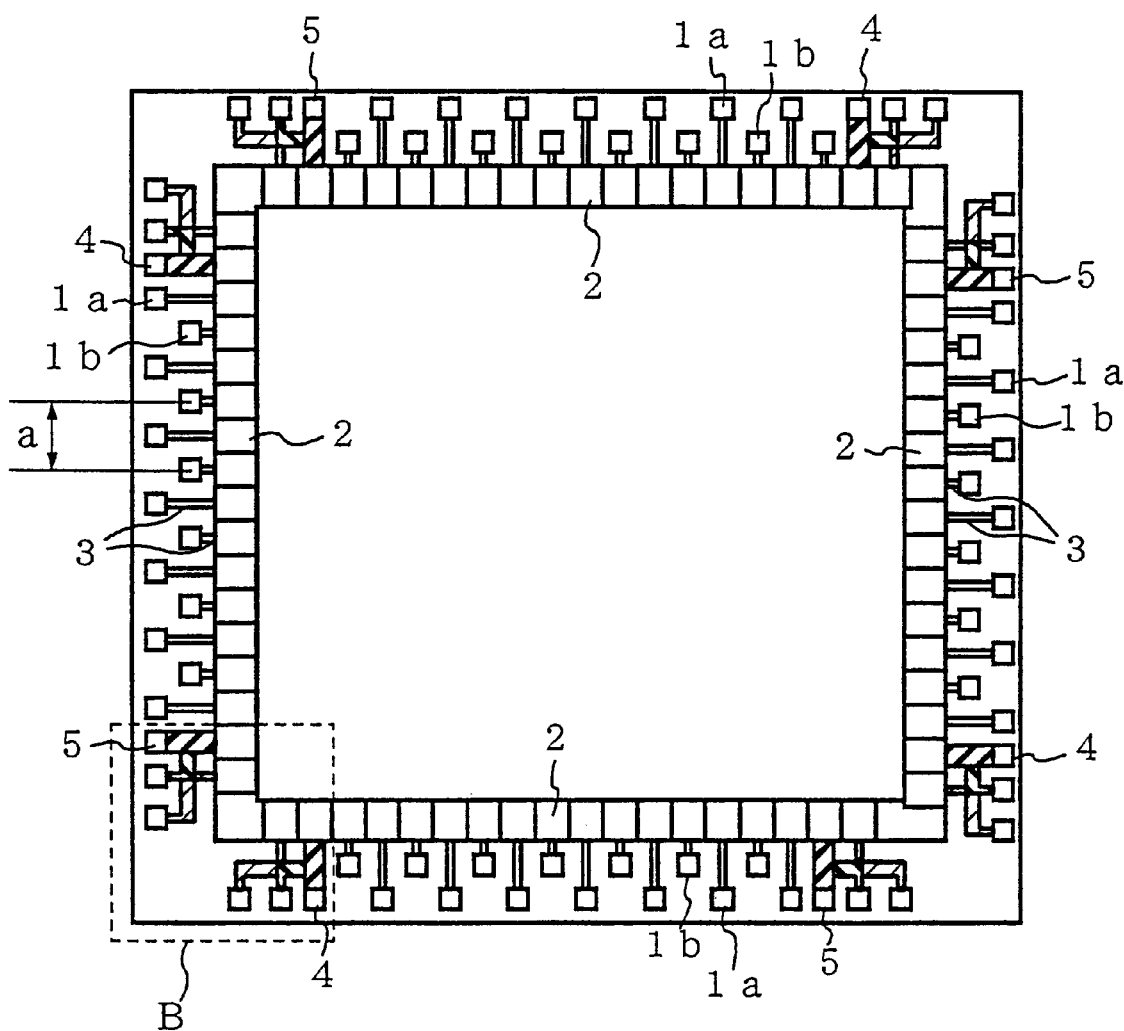
FIG. 1 is a view showing a chip configuration of a semiconductor device according to a first embodiment of the present invention.
Figure 2:
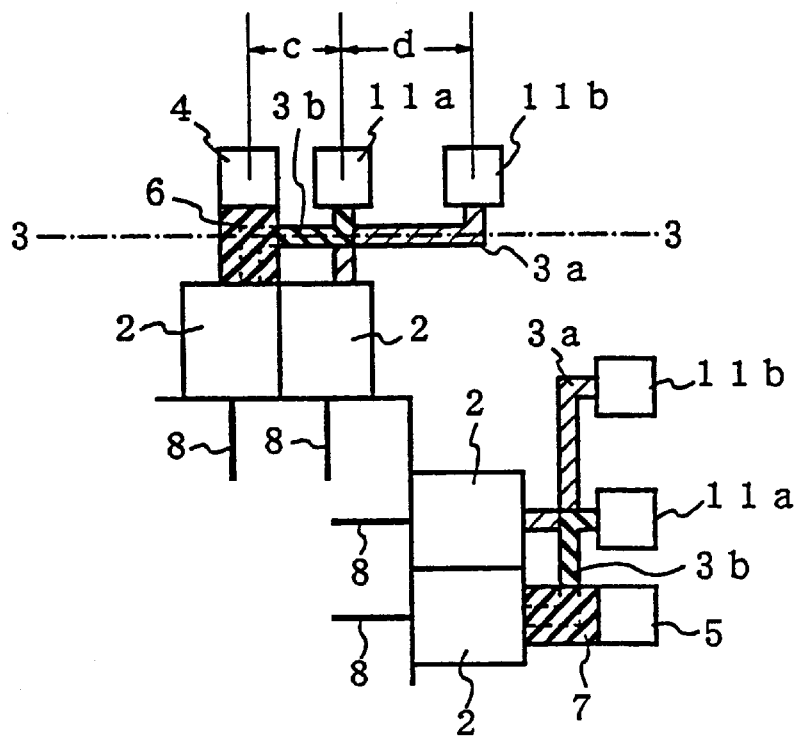
FIG. 2 is a partially enlarged view showing the semiconductor device according to the first embodiment of the present invention.
Figure 3:
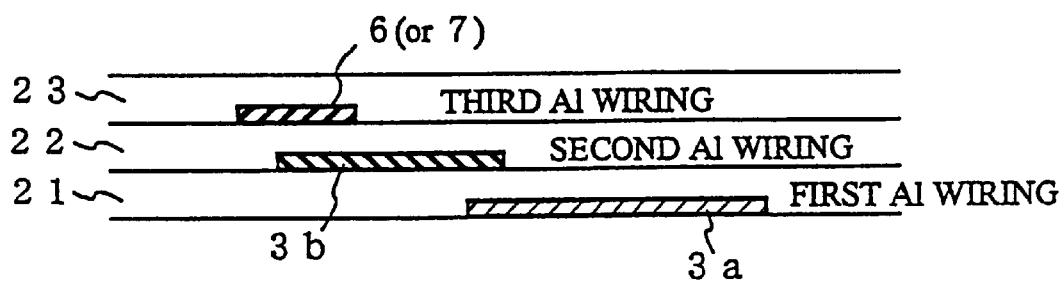
FIG. 3 is a sectional view of the semiconductor device according to the first embodiment of the present invention.

FIG. 1 is a view showing a configuration of a semiconductor device according to a first embodiment of the present invention; FIG. 2 is a view of a configuration of a portion B surrounded by a broken line of FIG. 1; and FIG. 3 is a sectional view taken on line 3—3 of FIG. 2. In these figures, reference numeral 1 indicates a bonding pad; 1a and 1b are an outer peripheral bonding pad and an inner peripheral bonding pad, respectively; reference numeral 2 is a buffer; reference numeral 3 is a wiring connecting each of the outer and inner peripheral bonding pads 1a and 1b to the buffer 2; reference numeral 4 is a bonding pad for a power supply; reference numeral 5 is a bonding pad for grounding; reference numeral 6 is a wiring connecting the power supply bonding pad to a power supply; reference numeral 7 is a wiring connecting the grounding bonding pad 5 to the ground; reference numeral 8 is an interconnection connecting the buffer 2 to an internal circuit; reference numeral 11a is a bonding pad connected to a signal line 3b made of Al or the like; reference numeral 11b is a bonding pad connected to a signal line 3a; reference numeral 21 is a first insulating film as a different insulating layer; reference numeral 22 is a second insulating film as another insulating layer; reference numeral 23 is a surface protective film. Further, character a indicates a pitch of each of the outer peripheral bonding pads 1a and the inner peripheral bonding pads 1b which are arranged in a staggered manner; c is a distance between the power supply bonding pad 4 and the bonding pad 11a; and d is a distance between the bonding pads 11a and 11b.

Since a large amount of current flows through the wiring 6 or 7 connected to a power supply or the ground, the width of the wiring 6 or 7 is larger than that of the wiring 3 as a signal line in order to ensure reliability against electromigration and the like. The wiring 6 or 7 is thus composed of a third Al wiring, different from the first and second Al wirings constituting the wirings 3. In general, upon wire bonding, the bonding pads are not superimposed on each other on one side of a semiconductor chip viewed from the vertical direction in order that the wirings do not short-circuit due to tangling.

According to the configuration of the first embodiment, the bonding pads 11a and 11b disposed near one corner of the chip are drawn toward the corner of the chip, and the power supply bonding pad 4 and/or the grounding bonding pad 5 are disposed in the empty spaces. Thus, the wirings for power supply and/or grounding can be ensured in the buffer region in which the buffers 2 are arranged, so that on buffer spaces for power supply and/or grounding are required to be newly provided at the corresponding positions in the buffer region. In the example shown in FIG. 3, the wiring 6 or 7 as the power supply line or grounding line is composed of the third Al wiring; however, it may be composed of the third or second Al wiring, insofar as it satisfies the requirement in design.

As described above, according to the first embodiment, the power supply or grounding potential can be wired without extension of the pitch a of the pads, and thereby can be supplied to the chip without a reduction in the number of usable I/O ports. Further, since the width of each of the wirings 6 and 7 connecting the corresponding power supply bonding pad 4 and the grounding bonding pad 5 to the power supply and the ground respectively can be sufficiently ensured, any influence exerted on the reliability of the IC can be eliminated.

Second Embodiment

Figure 4:
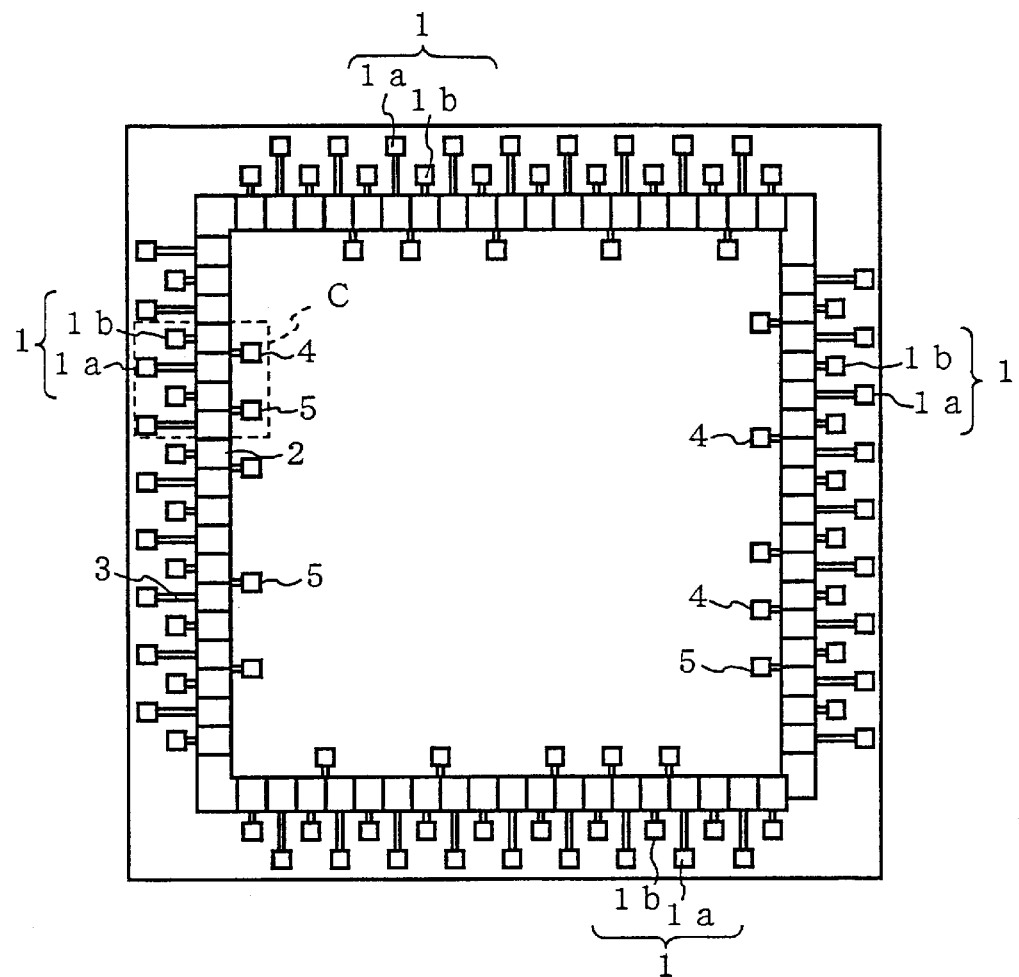
FIG. 4 is a view showing a chip configuration of a semiconductor device according to a second embodiment of the present invention.
Figure 5:
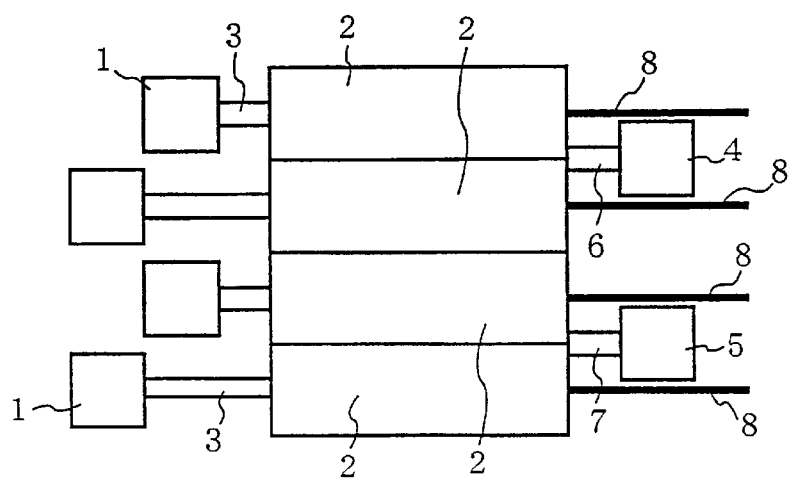
FIG. 5 is a partially enlarged view showing the semiconductor device according to the second embodiment of the present invention.

FIG. 4 is a view showing a configuration of a semiconductor device according to a second embodiment of the present invention; and FIG. 5 is a view showing a configuration of a portion C surrounded by a broken line of FIG. 4. In these figures, reference numeral 1 indicates a bonding pad; reference numerals 1a and 1b are an outer peripheral bonding pad and an inner peripheral bonding pad, respectively; reference numeral 2 is a buffer; reference numeral 3 is a wiring connecting each of the outer and inner peripheral bonding pads 1a and 1b to the buffer 2; reference numeral 4 is a bonding pad for power supply; reference numeral 5 is a bonding pad for grounding; reference numeral 6 is a wiring connecting the power supply bonding pad to a power supply; reference numeral 7 is a wiring connecting the grounding bonding pad to the ground; and reference numeral 8 is an interconnection connecting the buffer 2 to an internal circuit.

The outer and inner peripheral bonding pads 1a and 1b are used only for transmission of signals, and the innermost peripheral bonding pads 4 and 5 disposed inside the buffer region are used only for power supply and grounding, respectively. Accordingly, an area which has been conventionally ensured in the buffer region for power supply and grounding can be entirely used for the buffers 2 for signals, the size of the semiconductor chip can be reduced irrespective of the necessary number of the power supply pins and grounding pins on the chip. Further, it is possible to sufficiently ensure the width of the wiring 3 connecting each of the outer and inner peripheral bonding pads 1a and 1b to the buffer 2.

Figure 6:
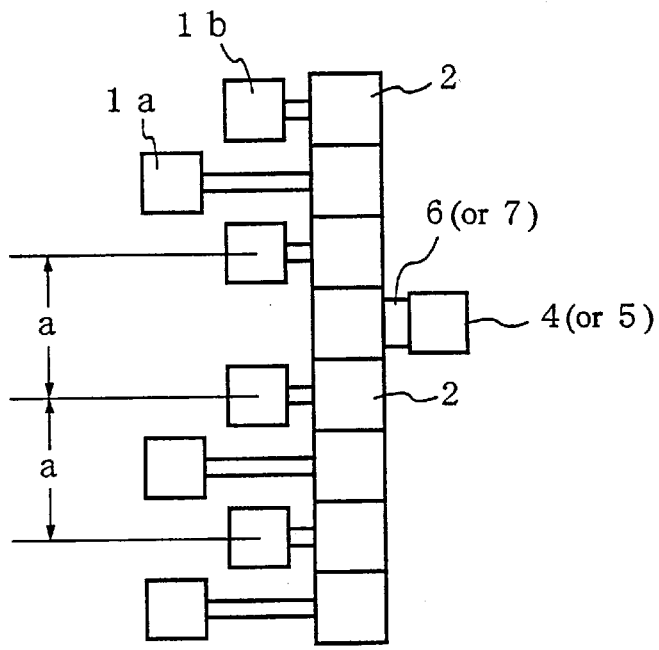
FIG. 6 is a partial view illustrating the semiconductor device according to the second embodiment of the present invention.
Figure 7:
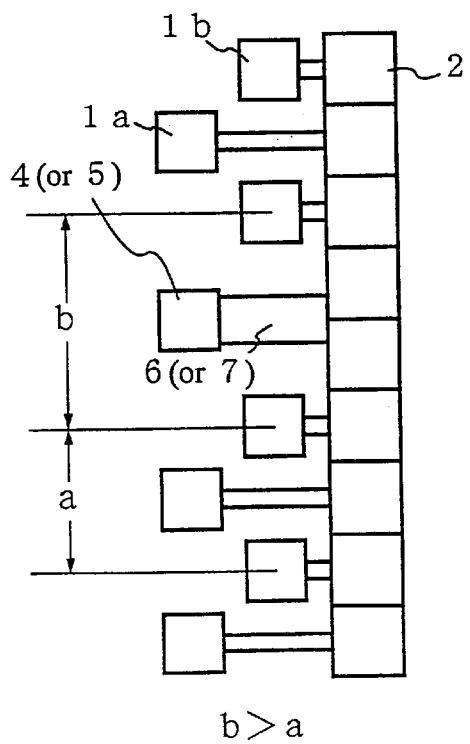
FIG. 7 is a partial view illustrating a prior art semiconductor device.
Figure 8:
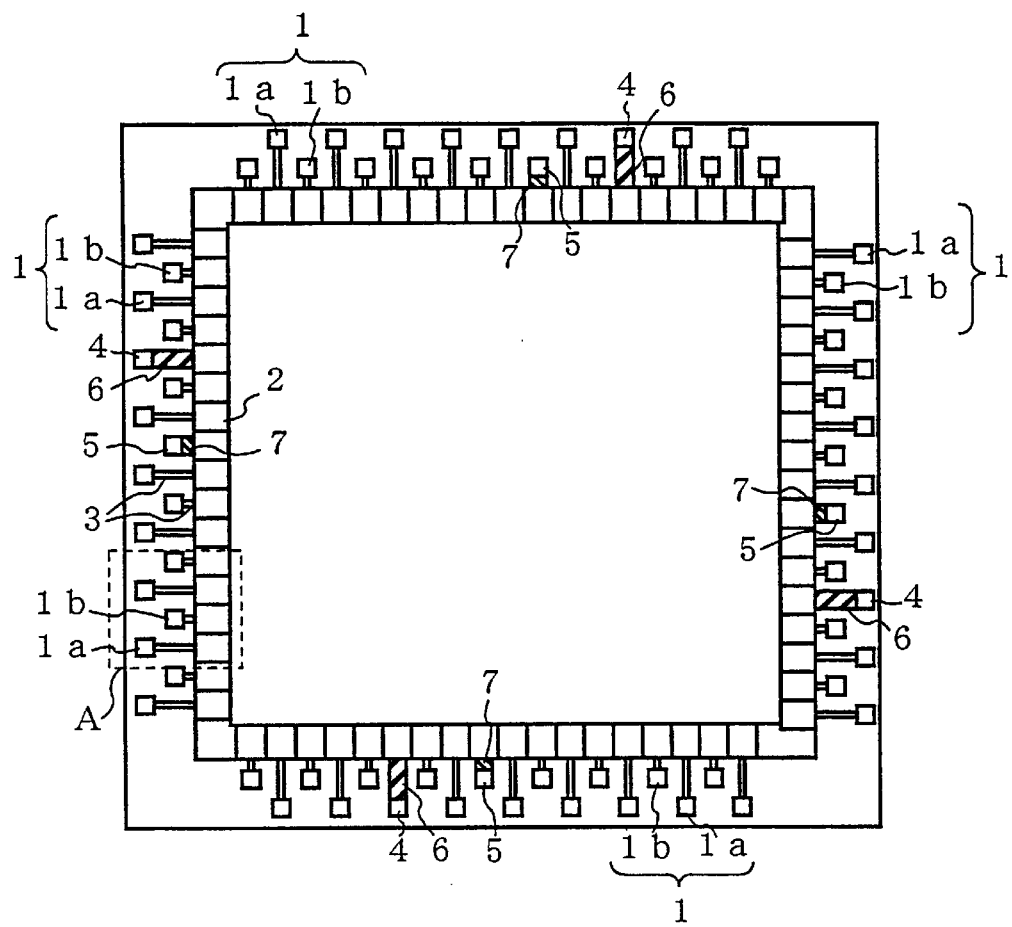
FIG. 8 is a view showing a chip configuration of the prior art semiconductor device.
Figure 9:
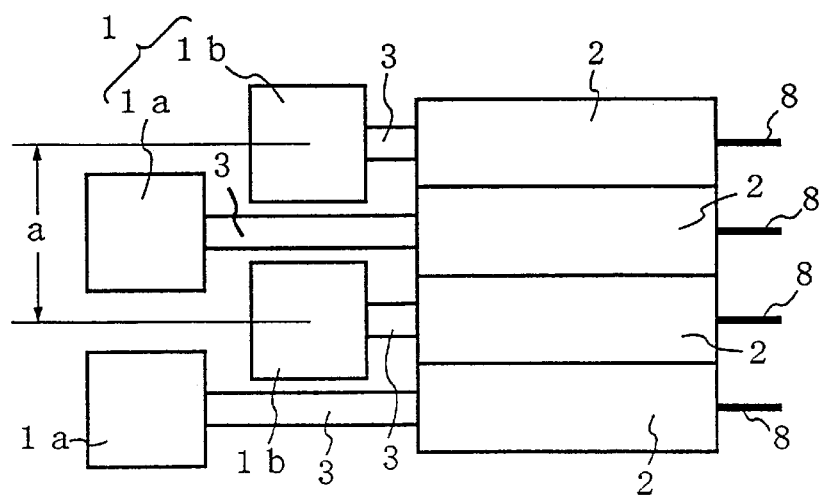
FIG. 9 is an enlarged view showing the prior art semiconductor device.

This will be described with reference to FIGS. 6 and 7. FIG. 6 is a partial view illustrating the second embodiment, and FIG. 7 is a partial view illustrating a prior art semiconductor device. In these figures, character a is a pitch of each of the bonding pads 1a and the bonding pads 1b which are arranged in a staggered manner; b is a pitch of the adjacent bonding pads 1b between which the power supply or grounding bonding pad 4 or 5 and the corresponding wiring 6 or 7 are arranged. In these figures, the other configuration is the same as that described above, and therefore, the same parts are indicated by the same characters and the overlapped explanation is omitted. First, in the prior art shown in FIG. 7, since the outer and inner peripheral signal bonding pads 1a and 1b and the power supply or grounding bonding pad 4 or 5 are arranged on the same side of the buffer region including a plurality of the buffers 2, the pitch b is larger than the pitch a because of the influence of the wiring 6 or 7 (connected to the power supply or grounding bonding pad 4 or 5) that is required to be wider due to a large amount of current passing therethrough. On the other hand, in the second embodiment shown in FIG. 6, since the power supply or grounding bonding pad 4 or 5 is disposed opposite to the outer and inner peripheral signal bonding pads 1a and 1b with respect to the buffer region including the buffers 2, the pitch a is not required to be extended so there is no difference between pitches (b-a), different from the example shown in FIG. 7.

As described above, according to the second embodiment, since the innermost bonding pads 4 and 5 can be used for the power supply and grounding lines and the outer and inner peripheral bonding pads 1a and 1b can be used for signal lines, an area which has been conventionally ensured in the buffer region for power supply and grounding can be allocated to the signal lines. Accordingly, there can be an increased number of usable I/O ports. Additionally, since the width of each wiring 3 connecting the bonding pad 1 to the buffer 2 can be sufficiently ensured, there can be obtained an effect of reducing the size of the semiconductor chip without affecting the reliability of the IC.

What is claimed is:

1. A semiconductor device comprising:

a semiconductor chip;

a buffer region having a plurality of buffers and disposed along a side of the semiconductor chip;

a pad region having a plurality of pads including respective pads corresponding to each of said buffers and disposed outside said buffer region attached to the side of said semiconductor chip;

signal lines connecting said buffers to the corresponding pads; and power supply lines and ground lines connected to respective pads, wherein at least one of said power supply lines or said ground lines is partially superimposed on and separated from said signal lines by first insulating layers.

2. The semiconductor device according to claim 1, wherein each of said signal lines comprises a first signal line and a second signal line partially superimposed on each other and separated by a second insulating layer.

3. A semiconductor device comprising:

a semiconductor chip;

a buffer region having a plurality of buffers and disposed along a side of the semiconductor chip;

a pad region having a plurality of pads including respective pads corresponding to each of said buffers, said pads being arranged outside said buffer region along a side of said semiconductor chip and connected to said buffers through signal lines; and pads disposed inside said buffer region relative to the side of said semiconductor chip and connected to power supply lines and ground lines.

4. The semiconductor device according to claim 3, wherein each of said signal lines comprises a first signal line and a second signal line partially superimposed on each other and separated by a second insulating layer.

5. The semiconductor device according to claim 3, wherein pads not connected to said signal lines in said pad region are connected to either the power supply lines or the ground lines, and either the power supply lines or the ground lines connected to said pads not connected to said signal lines are partially superimposed on part of and separated from aid signal lines by insulating layers.

* * * * *